(12) United States Patent
Sasaki

(10) Patent No.: US 7,811,945 B2
(45) Date of Patent: Oct. 12, 2010

(54) SELECTIVE PLASMA PROCESSING METHOD

(75) Inventor: Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 346 days.

(21) Appl. No.: 12/053,360

(22) Filed: Mar. 21, 2008

(65) Prior Publication Data

US 2008/0176413 A1    Jul. 24, 2008

Related U.S. Application Data

(63) Continuation of application No. PCT/JP2006/318730, filed on Sep. 21, 2006.

(30) Foreign Application Priority Data

Sep. 22, 2005    (JP)    ............... 2005-275874

(51) Int. Cl.
*H01L 21/469*    (2006.01)
*H01L 21/31*    (2006.01)

(52) U.S. Cl. ........... 438/771; 118/723 R; 257/E21.283; 257/E21.301; 257/E21.302; 438/776; 438/792

(58) Field of Classification Search ............ 118/723 R; 257/E21.283, E21.301, E21.302; 438/771, 438/776, 792
See application file for complete search history.

(56) References Cited

U.S. PATENT DOCUMENTS

| 2003/0194874 | A1 | 10/2003 | Ouchi | |
|---|---|---|---|---|
| 2003/0224616 | A1* | 12/2003 | Ogawa et al. | ............... 438/762 |
| 2004/0112541 | A1 | 6/2004 | Ishii et al. | |

FOREIGN PATENT DOCUMENTS

| CN | 1494737 A | 5/2004 |
|---|---|---|
| JP | 2002-222941 A | 8/2002 |
| JP | 2004-193409 A | 7/2004 |
| KR | 1996-9985 | 7/1996 |

* cited by examiner

*Primary Examiner*—Asok K Sarkar
(74) *Attorney, Agent, or Firm*—Oblon, Spivak, McClelland, Maier & Neustadt, L.L.P.

(57) ABSTRACT

A selective plasma processing method, within a processing chamber of a plasma processing apparatus, acts oxygen-containing plasma on a target object having silicon and a silicon nitride layer to selectively oxidize the silicon with respect to the silicon nitride layer and to form a silicon oxide film. Further, the ratio of a thickness of a silicon oxynitride film formed within the silicon nitride layer to a thickness of the silicon oxide film formed by the oxidization is equal to or smaller than 20%.

12 Claims, 14 Drawing Sheets

PLASMA OXIDATION PROCESSING

PLASMA NITRIDING PROCESSING

SELECTIVE PLASMA PROCESSING METHOD

This application is a Continuation Application of PCT International Application No. PCT/JP2006/318730 filed on Sep. 21, 2006, which designated the United States.

FIELD OF THE INVENTION

The present invention relates to a selective plasma processing method by which a target object, such as a semiconductor substrate or the like, can be processed by use of a plasma to selectively form a silicon oxide film or a silicon nitride film.

BACKGROUND OF THE INVENTION

In the process of manufacturing a variety of semiconductor devices, a silicon oxide film or a silicon nitride film is formed to be used in various applications, e.g., as a gate insulating film of a transistor. As for a method for forming the silicon oxide film or the silicon nitride film, there has been proposed a method of depositing a silicon oxide film or a silicon nitride film by CVD (Chemical Vapor Deposition) as well as a method of forming a silicon oxide film or a silicon nitride film by oxidizing or nitriding silicon through the use of plasma processing, which is disclosed in, e.g., Japanese Patent Laid-open Application Nos. 2000-260767A and 2003-115587A.

Since the step of oxidizing or nitriding silicon by a plasma is repeatedly performed in the process of manufacturing semiconductor devices as described above, it is typical that silicon (silicon layer) used as an object of oxidization or nitriding is mixed on a substrate together with a material film such as a silicon oxide film or a silicon nitride film formed in previous steps. If oxidization or nitriding is carried out on the mixed subsistence of different films, a previously formed silicon nitride film ($Si_3N_4$) can be oxidized into a silicon oxynitride film by subsequent plasma oxidization processing and, similarly, a previously formed silicon oxide film ($Si_3O_2$) may be nitrided into a silicon oxynitride film by subsequent plasma nitriding processing.

If, however, the material film other than target silicon is oxidized or nitrided in the semiconductor device manufacturing process, an etching selection ratio of the material film becomes different from those of other films in case when the material film is etched away in a subsequent step, thereby resulting in an undesirable effect, e.g., an increase in the number of steps or deterioration of yield.

SUMMARY OF THE INVENTION

It is, therefore, an object of the present invention to provide a selective plasma processing method by which, in a target object having silicon and a silicon nitride layer or a silicon oxide layer on its surface, the silicon can be oxidized or nitrided by a plasma with high selectivity with respect to the silicon nitride layer or the silicon oxide layer.

In accordance with a first aspect of the present invention, there is provided a selective plasma processing method for, within a processing chamber of a plasma processing apparatus, acting oxygen-containing plasma on a target object having silicon and a silicon nitride layer to selectively oxidize the silicon with respect to the silicon nitride layer and to form a silicon oxide film, wherein the ratio of a thickness of a silicon oxynitride film formed within the silicon nitride layer to a thickness of the silicon oxide film formed by the oxidization is equal to or smaller than 20%.

Preferably, the oxygen-containing plasma comprises microwave-excited high density plasma generated by introducing microwaves into the processing chamber through a planar antenna having a plurality of slots.

In accordance with a second aspect of the present invention, there is provided a selective plasma processing method for, within a processing chamber of a plasma processing apparatus, acting oxygen-containing plasma on a target object having a silicon exposing surface and a silicon nitride exposing surface to preferentially oxidize silicon on the silicon exposing surface in such a way that the ratio of a thickness of a silicon oxynitride film formed on the silicon nitride exposing surface to a thickness of a silicon oxide film formed on the silicon exposing surface becomes equal to or smaller than 20%.

In accordance with a third aspect of the present invention, there is provided a selective plasma processing method for, within a processing chamber of a plasma processing apparatus, acting nitrogen-containing plasma on a target object having silicon and a silicon oxide layer thereon to selectively nitride the silicon with respect to the silicon oxide layer and to form a silicon nitride film, wherein the ratio of a thickness of a silicon oxynitride film formed within the silicon oxide layer to a thickness of the silicon nitride film formed by the nitriding is equal to or smaller than 25%.

Preferably, the nitrogen-containing plasma comprises microwave excited high density plasma generated by introducing microwaves into the processing chamber through a planar antenna having a plurality of slots.

In accordance with a fourth aspect of the present invention, there is provided a selective plasma processing method for, within a processing chamber of a plasma processing apparatus, acting nitrogen-containing plasma on a target object having a silicon exposing surface and a silicon oxide exposing surface to preferentially oxidize silicon on the silicon exposing surface in such a way that the ratio of a thickness of a silicon oxynitride film formed on the silicon oxide exposing surface to a thickness of a silicon nitride film formed on the silicon exposing surface becomes equal to or smaller than 25%.

Preferably, the processing pressure ranges from 400 Pa to 1333 Pa.

In accordance with a fifth aspect of the present invention, there is provided a control program operable in a computer and adapted to, when executed, control a plasma processing apparatus to have the apparatus to perform a selective plasma processing method for, within a processing chamber of the plasma processing apparatus, acting oxygen-containing plasma on a target object having a silicon exposing surface and a silicon nitride exposing surface to preferentially oxidize silicon on the silicon exposing surface in such a way that the ratio of a thickness of a silicon oxynitride film formed on the silicon nitride exposing surface to a thickness of a silicon oxide film formed on the silicon exposing surface becomes equal to or smaller than 20%.

In accordance with a sixth aspect of the present invention, there is provided a computer-readable storage medium storing a control program operable in a computer, wherein the control program is adapted to, when executed, control a plasma processing apparatus to have the apparatus to perform a selective plasma processing method for, within a processing chamber of the plasma processing apparatus, acting oxygen-containing plasma on a target object having a silicon exposing surface and a silicon nitride exposing surface to preferentially oxidize silicon on the silicon exposing surface in such a way that the ratio of a thickness of a silicon oxynitride film formed on the silicon nitride exposing surface to a thickness of a silicon oxide film formed on the silicon exposing surface becomes equal to or smaller than 20%.

In accordance with a seventh aspect of the present invention, there is provided a plasma processing apparatus including: a vacuum-evacuated processing chamber including a table for supporting a target object; and a control part adapted to control the plasma processing apparatus to have the apparatus to perform a selective plasma processing method for, within the processing chamber, acting oxygen-containing plasma on the target object having a silicon exposing surface and a silicon nitride exposing surface to preferentially oxidize silicon on the silicon exposing surface in such a way that the ratio of a thickness of a silicon oxynitride film formed on the silicon nitride exposing surface to a thickness of a silicon oxide film formed on the silicon exposing surface becomes equal to or smaller than 20%.

In accordance with an eighth aspect of the present invention, there is provided a control program operable in a computer and adapted to, when executed, control a plasma processing apparatus to have the apparatus to perform a selective plasma processing method for, within a processing chamber of the plasma processing apparatus, acting nitrogen-containing plasma on a target object having a silicon exposing surface and a silicon oxide exposing surface to preferentially nitride silicon on the silicon exposing surface in such a way that the ratio of a thickness of a silicon oxynitride film formed on the silicon oxide exposing surface to a thickness of a silicon nitride film formed on the silicon exposing surface becomes equal to or smaller than 25%.

In accordance with a ninth aspect of the present invention, there is provided a computer-readable storage medium storing a control program operable in a computer, wherein the control program is adapted to, when executed, control a plasma processing apparatus to have the apparatus to perform a selective plasma processing method for, within a processing chamber of the plasma processing apparatus, acting nitrogen-containing plasma on a target object having a silicon exposing surface and a silicon oxide exposing surface to preferentially nitride silicon on the silicon exposing surface in such a way that the ratio of a thickness of a silicon oxynitride film formed on the silicon oxide exposing surface to a thickness of a silicon nitride film formed on the silicon exposing surface becomes equal to or smaller than 25%.

In accordance with a tenth aspect of the present invention, there is provided a plasma processing apparatus including: a vacuum evacuable processing chamber including a mounting table for mounting a target object; and a controller adapted to control the plasma processing apparatus to have the apparatus to perform a selective plasma processing method for, within the processing chamber, acting nitrogen-containing plasma on the target object having a silicon exposing surface and a silicon oxide exposing surface to preferentially nitride silicon on the silicon exposing surface in such a way that the ratio of a thickness of a silicon oxynitride film formed on the silicon oxide exposing surface to a thickness of a silicon nitride film formed on the silicon exposing surface becomes equal to or smaller than 25%.

The present invention makes it possible that, in a target object having silicon and a silicon nitride (SiN) layer or a silicon oxide ($SiO_2$) layer on its surface, the silicon is oxidized or nitrided by the plasma with high selectivity.

That is to say, even if a nitride film or an oxide film other than target silicon subsists on a target object, it is possible to preferentially oxidize or nitride the target silicon. This minimizes an adverse effect on the process, thereby making it possible to carry out the processing in an effective manner.

DETAILED DESCRIPTION OF THE EMBODIMENTS

Figure 1:
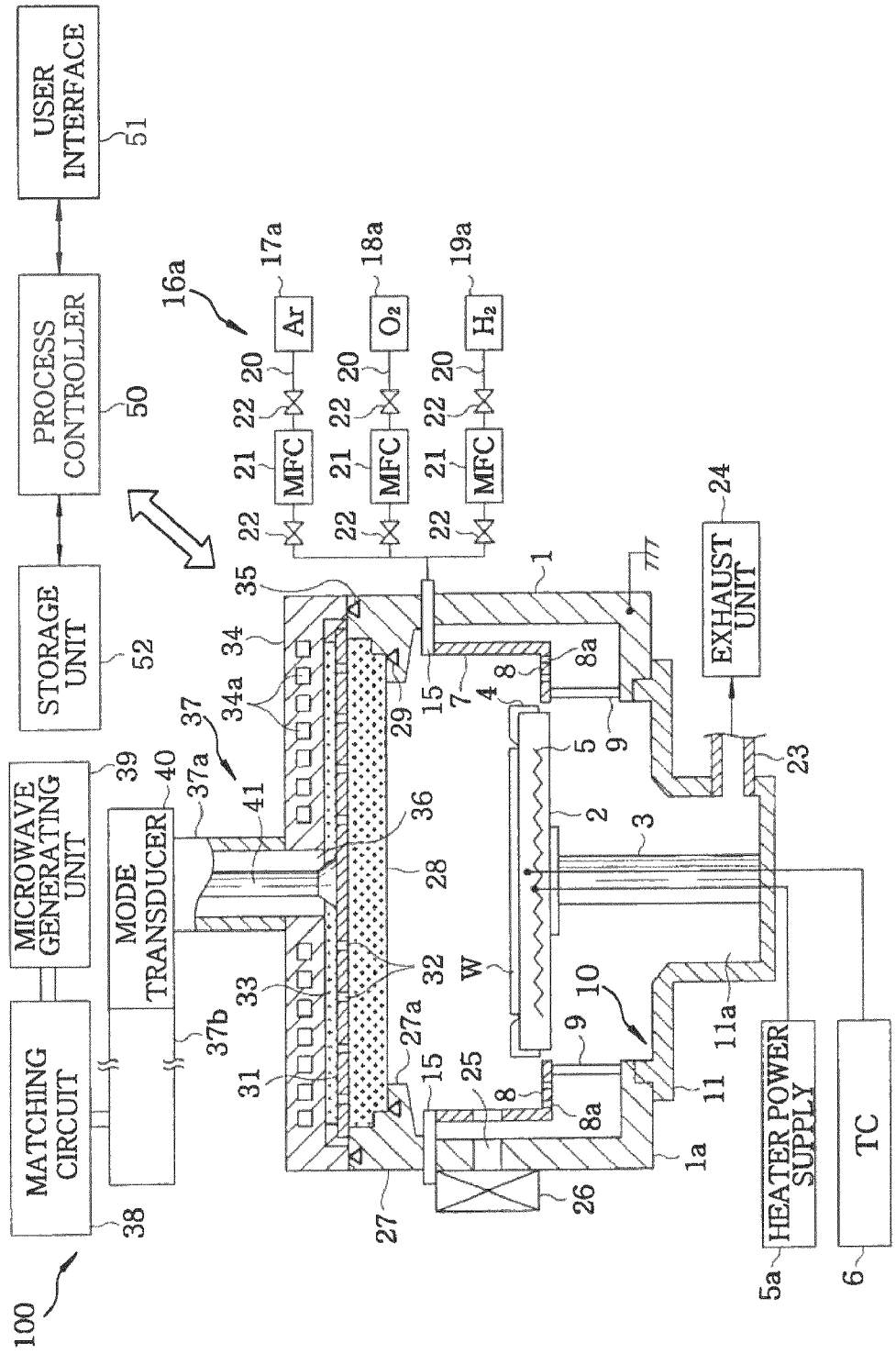
FIG. 1 is a schematic cross sectional view showing one exemplary plasma oxidization processing apparatus applicable in the present invention.

Hereinafter, embodiments of the present invention will be described in detail with reference to the accompanying drawings. FIG. 1 is a cross sectional view schematically showing one example of a plasma oxidization processing apparatus that can be suitably used in a plasma oxidization processing method of the present invention. The plasma oxidization processing apparatus 100 includes a planar antenna provided with a plurality of slots, e.g., an RLSA (Radial Line Slot Antenna) microwave plasma oxidization processing apparatus that can generate a microwave-excited plasma of high density and low electron temperature by introducing microwaves into a processing chamber through a radial line slot antenna. The plasma oxidization processing apparatus 100 is capable of processing an object with a plasma of a density ranging from $1\times10^{10}$ to $5\times10^{12}/cm^3$ and an electron temperature ranging from 0.7 to 2 eV. Accordingly, the plasma oxidization processing apparatus 100 can be suitably used to form a silicon oxide film or the like in the process of manufacturing various kinds of semiconductor devices.

The plasma oxidization processing apparatus 100 includes a generally cylindrical chamber 1 which is hermetically formed and electrically grounded. A circular opening 10 is formed substantially in the central portion of a bottom wall 1a of the chamber 1. In the bottom wall 1a, there is provided an exhaust chamber 11 that communicates with the opening 10 and protrudes downwardly. The exhaust chamber 11 is connected to a gas exhaust unit 24 through an exhaust pipe 23.

Within the chamber 1, there is provided a mounting table 2 made of ceramics such as AlN or the like for horizontally holding a silicon wafer W (hereinafter simply referred to as "wafer"), a processing substrate. The mounting table 2 is supported by a cylindrical support member 3 made of ceramics such as AlN or the like and extending upwardly from a bottom central portion of the exhaust chamber 11. The mounting table 2 is provided with a cover ring 4 for covering an edge portion of the mounting table 2 and guiding the wafer W. The cover ring 4 is a member made of, e.g., quartz, AlN, $Al_2O_3$, SiN or the like.

A resistance-heating type heater 5 is embedded in the mounting table 2. The heater 5 is adapted to heat the mounting table 2 by using the electricity supplied from a heater power source 5a. The wafer W, a processing substrate, is heated by the thermal energy from the mounting table 2. A thermocouple (TC) 6 is arranged in the mounting table 2 to control a heating temperature of the wafer W within an extent ranging from the room temperature to 900° C. Wafer support pins (not shown) for supporting and vertically moving the wafer W are provided in the mounting table 2 in such a manner that they can protrude and retract with respect to a surface of the mounting table 2.

On an inner periphery of the chamber 1, there is provided a quartz-made cylindrical liner 7 that serves to prevent metal contamination which would otherwise be caused by a chamber-constituting material. Around an outer periphery of the mounting table 2, there is provided an annular baffle plate 8 having a multiple number of through-holes 8a through which the inside of the chamber 1 is uniformly evacuated. The baffle plate 8 is supported by a plurality of support columns 9.

A ring-shaped gas introduction portion 15 is provided in the sidewall of the chamber 1 and a gas supply system 16a is connected to the gas introduction portion 15. Alternatively, the gas introduction portion may be arranged in a nozzle shape or a shower head shape. The gas supply system 16a includes, e.g., an Ar gas source 17a, an O2 gas source 18a and a H2 gas source 19a. An Ar gas, an O2 gas and a H2 gas are fed to the gas introduction portion 15 via respective gas lines 20 to be introduced into the chamber 1 through the gas introduction portion 15. In the respective gas lines 20, there are provided mass flow controllers 21 and opening/closing valves 22, the latter being arranged before and after the former. In place of the Ar gas, it may be possible to use a rare gas, e.g., a Kr gas, a Xe gas or a He gas or the like.

The exhaust pipe 23 is connected to a side surface of the evacuation chamber 11 and the gas exhaust unit 24, including a high-speed vacuum pump, is coupled to the exhaust pipe 23. By operating the gas exhaust unit 24, the gas in the chamber 1 is uniformly discharged into a space 11a of the evacuation chamber 11 through the baffle plate 8 and then exhausted through the exhaust pipe 23. This makes it possible to rapidly depressurize the inside of the chamber 1 to a specified vacuum degree, e.g., 0.133 Pa.

In a sidewall of the chamber 1, there is provided a loading/unloading port 25 through which the wafer W is transported in and out between the chamber 1 and a transportation chamber (not shown) located adjacent to the plasma oxidization processing apparatus 100. The loading/unloading port 25 is opened and closed by means of a gate valve 26 also provided in the sidewall of the chamber 1.

The chamber 1 has a top opening to which an annular shaped upper plate 27 is bonded. The upper plate 27 protrudes at its bottom inner peripheral portion toward an inner space of the chamber to thereby form an annular support portion 27a. Air-tightly supported by the support portion 27a through a sealing member 29 is a microwave transmitting plate 28 made of a dielectric material, e.g., quartz or ceramics such as $Al_2O_3$, AlN or the like, and capable of transmitting microwaves. This keeps the inside of the chamber 1 airtight.

A disc-shaped planar antenna member 31 is provided above the transmitting plate 28 so that it can face the mounting table 2. The planar antenna member is not limited to the disc shape but may be of, e.g., a rectangular plate shape. The planar antenna member 31 is engaged to the top end of the sidewall of the chamber 1. The planar antenna member 31 is formed of, e.g., a copper plate or an aluminum plate whose surface is plated with gold or silver. A multiple number of slot-shaped microwave irradiation holes 32 through which microwaves are irradiated are formed through the planar antenna member 31 in a specified pattern.

Figure 2:
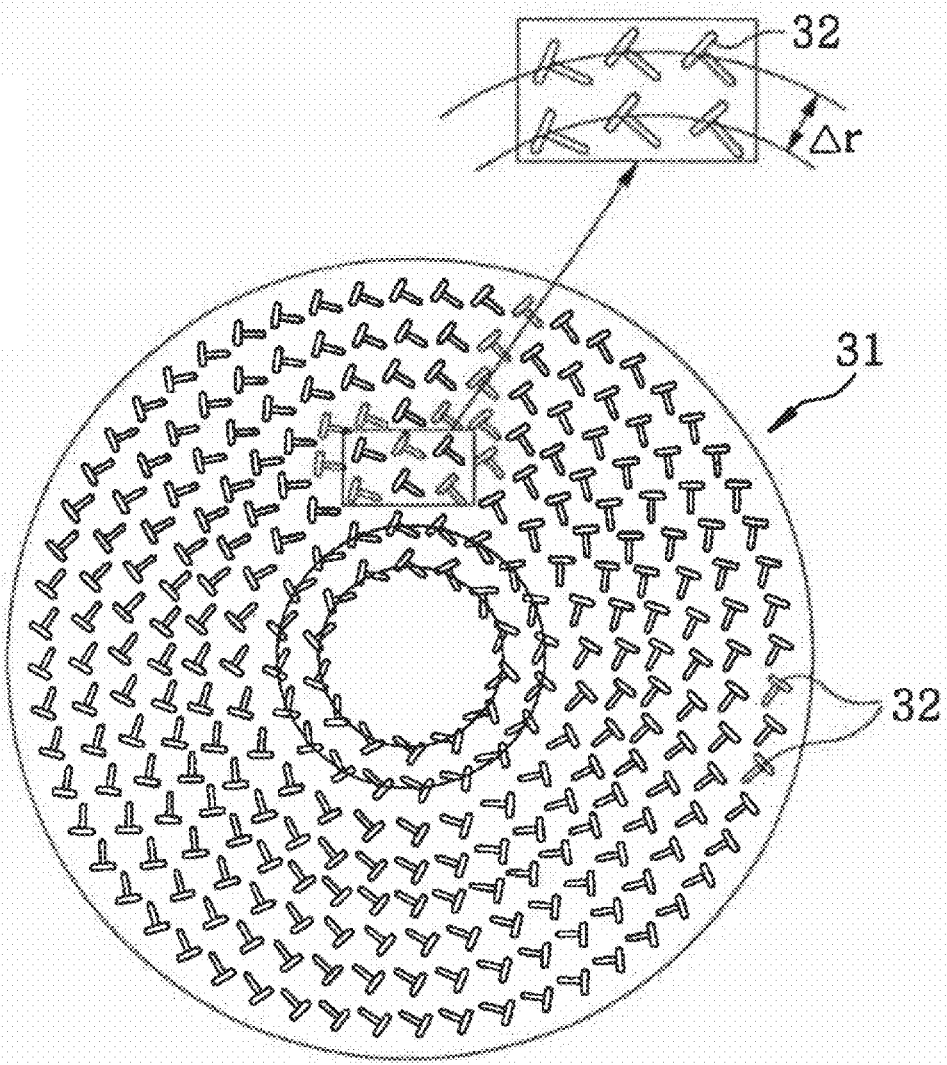
FIG. 2 is a view for explaining a planar antenna member.

Each of the microwave irradiation holes 32 is of, e.g., a slot shape as shown in FIG. 2, and two adjoining microwave irradiation holes 32 are typically arranged to form a "T"-shape. The microwave irradiation holes 32 are arranged to be aligned on a concentric pattern. The length and interval of the microwave irradiation holes 32 is determined by the wavelength $\lambda_g$ of microwaves. For instance, the microwave irradiation holes 32 are arranged in an interval of $\lambda_g/4$, $\lambda_g/2$ or $\lambda_g$. In FIG. 2, $\Delta_r$ denotes an interval between the concentrically arranged microwave irradiation holes 32. Alternatively, the microwave irradiation holes 32 may be of other shapes such as a circular shape and an arc shape. The microwave irradiation holes 32 are not particularly limited in their arrangement pattern but may be arranged, e.g., in a spiral pattern or a radial pattern, instead of the concentric pattern.

A retardation member 33 having a dielectric constant greater than that of vacuum is provided on the top surface of the planar antenna member 31. Since the wavelength of a microwave increases in a vacuum state, the retardation member 33 that is capable of shortening the wavelength of a microwave can serve to control the function of a plasma. Close contacts are preferably maintained between the planar antenna member 31 and the transmitting plate 28 and between the retardation member 33 and the planar antenna member 31, although they may be either closely contacted with or separated from each other.

A cover 34 made of a metallic material, e.g., aluminum or stainless steel, is provided on the top surface of the chamber 1 so that it can cover the planar antenna member 31 and the retardation member 33. The gap between the top surface of the chamber 1 and the cover 34 is sealed by means of a sealing member 35. A cooling water flow path 34a is formed in the cover 34. The cover 34, the retardation member 33, the planar antenna member 31 and the microwave transmitting plate 28 are cooled by circulating cooling water through the cooling water flow path 34a. The cover 34 is electrically grounded.

An opening 36 is formed at the center of a top wall of the cover 34 and a waveguide 37 is connected to this opening. A microwave generating unit 39 for generating microwaves is connected to a distal end of the waveguide 37 via a matching circuit 38. This ensures that microwaves of, e.g., 2.45 GHz in frequency, generated in the microwave generating unit 39, are transmitted to the planar antenna member 31 through the waveguide 37. The frequency of microwaves may be 8.35 GHz, 1.98 GHz or other values.

The waveguide 37 includes a coaxial waveguide 37a having a circular cross sectional shape and extending upwardly from the opening 36 of the cover 34 and a horizontally-extending rectangular waveguide 37b connected to the top end portion of the coaxial waveguide 37a via a mode transducer 40. The mode transducer 40 arranged between the rectangular waveguide 37b and the coaxial waveguide 37a has a function of converting a TE mode of the microwaves propagating through the rectangular waveguide 37b to a TEM mode. An internal conductor 41 extends through the center of the coaxial waveguide 37a. The internal conductor 41 is connected and fixed at its bottom end portion to the center of the planar antenna member 31. This ensures that the microwaves are efficiently and uniformly propagated radially toward the planar antenna member 31 through the internal conductor 41 within the coaxial waveguide 37a.

Every part forming the plasma oxidization processing apparatus 100 is connected to and controlled by a process controller 50 having a CPU. Connected to the process controller 50 is a user interface 51 that includes a keyboard with which a process manager performs a command input operation to manage the plasma oxidization processing apparatus 100, a display for visually displaying an operating status of the plasma oxidization processing apparatus 100, and the like.

Further, also connected to the process controller 50 is a storage unit 52 that stores a control program (software) for realizing, under control of the process controller 50, various kinds of processing performed in the plasma oxidization processing apparatus 100 and recipes in which processing condition data or the like are recorded.

When necessary, an arbitrary recipe is retrieved from the storage unit 52 by inputting an instruction through the user interface 51 and is performed by the process controller 50. By doing so, a desired processing is performed in the plasma oxidization processing apparatus 100 under the control of the process controller 50. Alternatively, the control program and the recipes of processing condition data or the like may be the ones stored in a computer-readable storage medium, e.g., a CD-ROM, a hard disk, a flexible disk or a flash memory or may be received from other devices from time to time, e.g., via a dedicated line when necessary and used on an on-line basis.

In the RLSA-type plasma oxidization processing apparatus 100 as configured above, it is possible to perform the processing of selectively oxidizing silicon (polycrystalline or monocrystalline silicon) of the wafer W to thereby form a silicon oxide film. The order of this processing will be described herein below.

First, by opening the gate valve 26, the wafer W having a silicon surface and a silicon nitride surface is loaded into the chamber 1 through the loading/unloading port 25 and is mounted on the mounting table 2. Then, an Ar gas, an $O_2$ gas and a $H_2$ gas are respectively introduced from the Ar gas source 17a, the $O_2$ gas source 18a and the $H_2$ gas source 19a of the gas supply system 16a into the chamber 1 through the gas introduction portion 15 at respective flow rates.

More specifically, as an example, the flow rate of a rare gas including the Ar gas is set to range from 100 to 3000 mL/min (sccm), the flow rate of the $O_2$ gas is set to range from 5 to 500 mL/min (sccm), and the flow rate of the $H_2$ gas is set to range from 5 to 500 mL/min (sccm). The chamber is controlled to have an inner processing pressure of 400 Pa (3 Torr) or higher and preferably to range from 400 Pa to 1333 Pa (3 Torr to 10 Torr). The wafer W is heated up to a temperature ranging from about 250 to 800° C. and preferably ranging from about 400 to 600° C. If the processing pressure is lower than 400 Pa at this time, the ion energy, ion density and electron temperature of plasma become increased relatively high. Therefore, it becomes impossible to obtain high enough oxidization selectivity of silicon with respect to a silicon nitride film ($Si_3N_4$) already subsisting on the wafer W as can be seen in the below-described experimental examples.

Next, the microwaves generated in the microwave generating unit 39 are guided to the waveguide 37 via the matching circuit 38 and then allowed to sequentially pass the rectangular waveguide 37b, the mode transducer 40 and the coaxial waveguide 37a, whereby the microwaves are supplied to the planar antenna member 31 through the internal conductor 41. The microwaves are then irradiated through the microwave irradiation holes 32 of the planar antenna member 31 toward the space of the chamber 1 above the wafer W through the transmitting plate 28. Within the rectangular waveguide 37b, the microwaves are propagated in a TE mode and converted to a TEM mode in the mode transducer 40. Then, the microwaves are propagated toward the planar antenna member 31 through the coaxial waveguide 37a. At this time, the microwaves may have power ranging from, e.g., 500 to 4000 W.

An electromagnetic field is formed within the chamber 1 by the microwaves irradiated from the planar antenna member 31 into the chamber 1 through the transmitting plate 28, whereby the Ar gas, the $O_2$ gas and the $H_2$ gas are converted into a plasma. In this case, the plasma may be generated by supplying only the Ar gas and the $O_2$ gas. Thanks to the fact that the microwaves are irradiated through the multiple number of microwave irradiation holes 32 of the planar antenna member 31, the oxygen-containing plasma has a high density ranging from about $1 \times 10^{10}$ to $5 \times 10^{12}/cm^3$ and a low electron temperature of about 1.2 eV or less in the vicinity of the wafer W. The highly selective oxygen-containing plasma formed under this high pressure state exhibits low ion content and low ion energy and, therefore, helps to reduce plasma damage caused by ions or the like. In addition, by controlling the quantity of active species, mainly O-radicals, contained in the $Ar/O_2/H_2$ plasma, oxygen is selectively introduced into silicon without oxidizing silicon nitride, whereby silicon atoms are reacted with the active oxygen radicals to thereby form a uniform $SiO_2$ film on the surface of silicon.

In the present embodiment, the wafer W having a silicon (polycrystalline or monocrystalline silicon) surface and a silicon nitride surface is oxidized by the plasma oxidization processing apparatus 100 to form a silicon oxide film on the silicon surface. By maintaining the processing pressure at 400 Pa or higher and preferably ranging from 400 to 1333 Pa in this plasma processing, it is possible to generate highly selective plasma and, consequently, to oxidize silicon with high selectivity with respect to a silicon nitride film ($Si_3N_4$) subsisting on the wafer W (namely, it is preferable that the silicon nitride film is not oxidized).

In this manner, a silicon oxide film of high quality can be formed on a monocrystalline or polycrystalline silicon surface with high selectivity but without oxidizing a silicon nitride surface. Accordingly, the plasma oxidization processing method of the present embodiment can be used to form a silicon oxide film in the manufacture of various kinds of semiconductor devices.

Next, description will be made on experimental examples of the selective plasma oxidization processing method of the present invention.

Figure 3A:
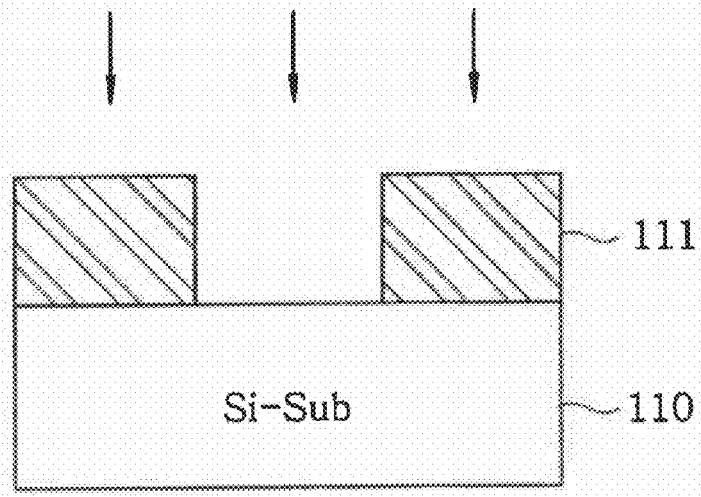
FIG. 3A is a view explaining a structure of an experimental model for selective plasma oxidization processing and shows a state during execution of the plasma oxidization processing.
Figure 3B:
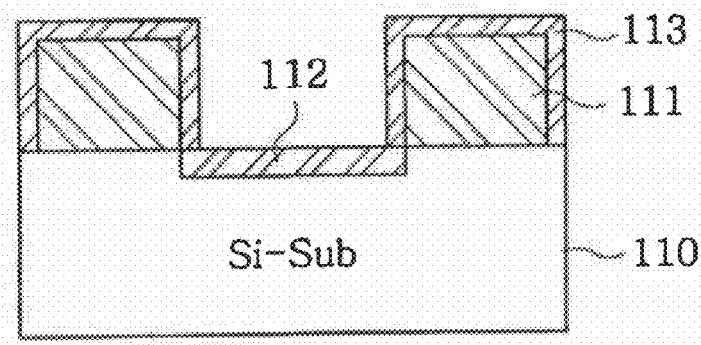
FIG. 3B is a view explaining a structure of an experimental model for selective plasma oxidization processing and shows a state after execution of the plasma oxidization processing.
Figure 4A:
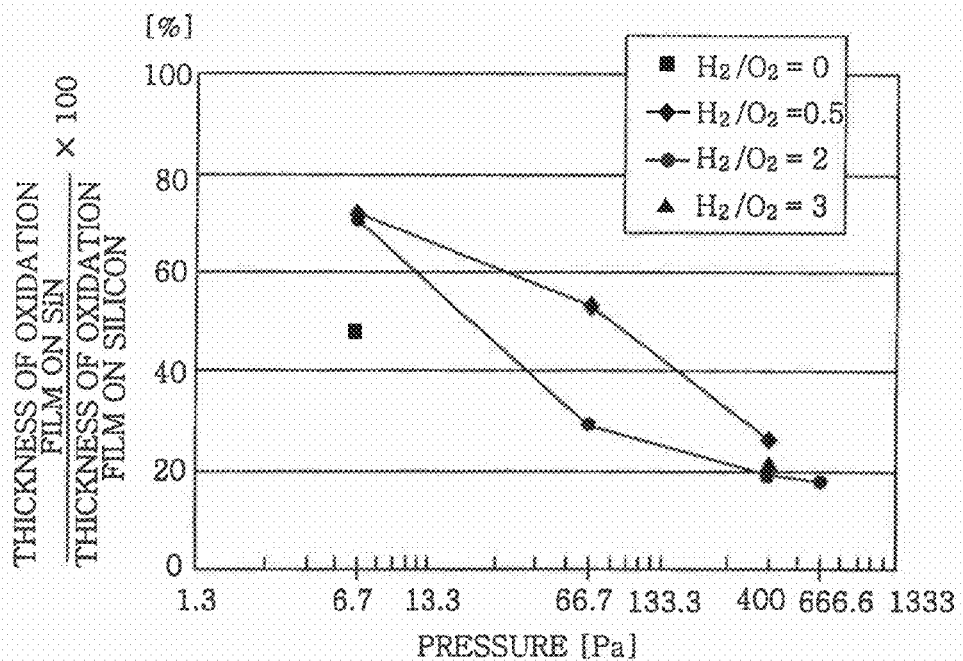
FIG. 4A is a graph representing a relationship between a processing pressure and an oxide film thickness ratio (thickness of an oxide film on SiN/thickness of an oxide film on Si) in the plasma oxidization processing.
Figure 4B:
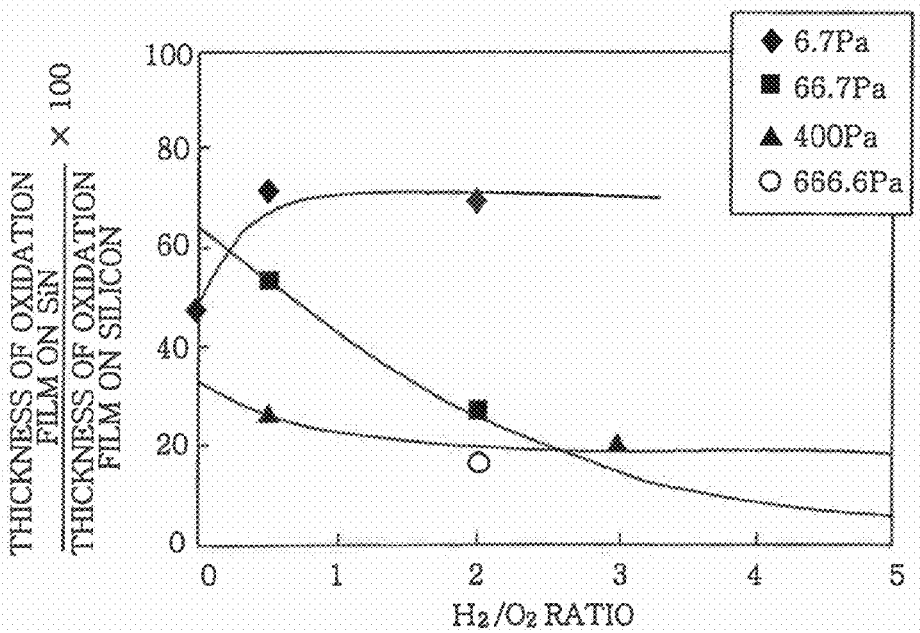
FIG. 4B is a graph representing the relationship between a $H_2O_2$ ratio and an oxide film thickness ratio (thickness of an oxide film on SiN/thickness of an oxide film on Si) in the plasma oxidization processing.

As shown in FIG. 3A, a target object having a silicon surface and a silicon nitride surface, which is resulted from formation of a patterned silicon nitride ($Si_3N_4$) layer 111 on a Si substrate 110, was plasma-oxidized under different pressures by using the plasma oxidization processing apparatus 100 shown in FIG. 1. FIG. 3B shows a $SiO_2$ film 112 formed on the Si substrate 110 and a SiON film 113 formed on the surface of the $Si_3N_4$ layer 111 after execution of the plasma oxidization processing. FIGS. 4A and 4B represent the results of investigation on a ratio of the thickness of the SiON film 113 formed on the surface of the $Si_3N_4$ layer 111 to the thickness of the $SiO_2$ film 112 formed on the Si substrate 110 after execution of the plasma oxidization processing.

Referring to conditions of the plasma oxidization processing, a gas system including Ar and $O_2$ or a gas system including Ar, $O_2$ and $H_2$ was used as the processing gas. Turning to a $H_2/O_2$ ratio, the flow rates of Ar and $O_2$ were set equal to 1000 and 500 mL/min (sccm), respectively, when $H_2/O_2=0$. The flow rates of Ar, $O_2$ and $H_2$ were set equal to 1000, 100 and 50 mL/min (sccm), respectively, when $H_2/O_2=0.5$. The flow rates of Ar, $O_2$ and $H_2$ were set equal to 1000, 100 and 200 mL/min (sccm), respectively, when $H_2/O_2=2$. The flow rates of Ar, $O_2$ and $H_2$ were set equal to 1000, 100 and 300 mL/min (sccm), respectively, when $H_2/O_2=3$.

The processing pressures were set equal to 6.7 Pa (50 m Torr), 66.7 Pa (500 m Torr), 400 Pa (3 Torr) and 666.6 Pa (5 Torr). The processing temperature was set equal to 400° C. while setting the microwave power equal to 3.4 kW. Then, plasma oxidization processing was performed under a condition that a silicon oxide film of 4 nm in thickness could be formed on the silicon substrate.

It can be seen in FIGS. 4A and 4B that the ratio of the thickness of the SiON film 113 formed on the surface of the $Si_3N_4$ layer 111 to the thickness of the $SiO_2$ film 112 formed on the Si substrate 110 was reduced along with the increase in processing pressure regardless of the $H_2/O_2$ ratio, thereby providing high selectivity. In particular, if the $H_2/O_2$ ratio is equal to or greater than 2 and the processing pressure exceeds 400 Pa, the ratio of the thickness of the SiON film 113 formed on the surface of the $Si_3N_4$ layer 111 to the thickness of the $SiO_2$ film 112 formed on the Si substrate 110 became smaller than 20%, which means that it is possible to perform such processing that oxidizes silicon on the wafer W but scarcely oxidizes the $Si_3N_4$ layer 111. Accordingly, it is preferable to use Ar, $O_2$ and $H_2$ as the processing gas. At the processing pressure of 400 Pa or more, it was confirmed that the $H_2/O_2$ ratio should be preferably equal to or greater than 1.5 and more preferably equal to or greater than 2. If only Ar and $O_2$ are used as the processing gas, the oxidization rate is decreased along with the increase in processing pressure, thereby making it impossible to form a film of a great enough thickness for practical use. Thus, it is preferable to use hydrogen in combination.

Although no data is shown, it is also possible in thermal oxidization processing to oxidize silicon while hardly oxidizing the $Si_3N_4$ layer 111. Seeing that the thermal oxidization processing is carried out at a high temperature of 900° C. or higher, however, it poses a problem in that a thermal budget is increased and distortion occurs in the wafer W (Si substrate) due to a thermal stress. Therefore, the selective plasma oxidization processing of the present invention capable of performing selective oxidization at a low temperature of about 400° C. is more advantageous to use than the thermal oxidization processing.

Next, a preferred application example of the selective plasma oxidization processing of the present invention will be described with reference to FIGS. 5A and 5B. Description will be given herein on an example in which the selective plasma oxidization processing of the present embodiment is applied to a full-silicide formation process used in forming a metal gate electrode of a transistor. The full-silicide formation process is a method of forming a silicide gate electrode, which includes the steps of depositing polycrystalline silicon, but not metal, as a gate electrode, forming a shape of the electrode by etching or the like and then causing a silicide formation reaction to propagate to a boundary surface of a gate insulating film by diffusing metal from the top.

Figure 5A:
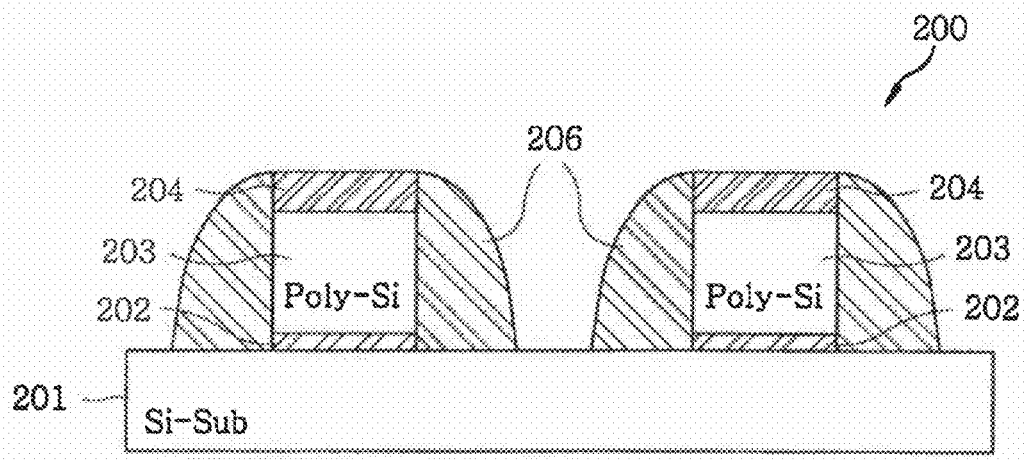
FIG. 5A is a view explaining a state before execution of the plasma oxidization processing, in case the selective plasma oxidization processing of the present invention is applied to a full-silicide formation process.
Figure 5B:
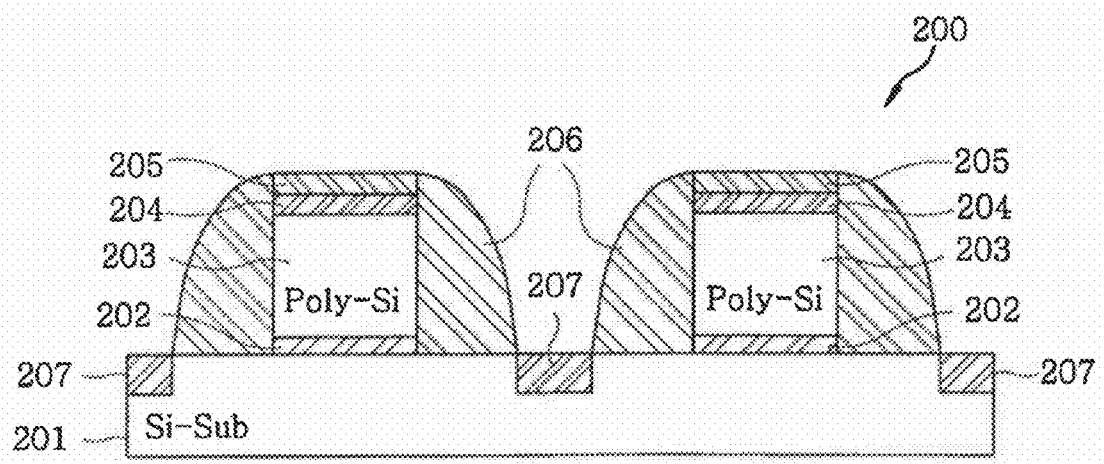
FIG. 5B is a view explaining a state after execution of the plasma oxidization processing, in case the selective plasma oxidization processing of the present invention is applied to a full-silicide forming process.

As illustrated in FIG. 5A, a gate insulating film 202, a polysilicon layer 203 and a $Si_3N_4$ layer 204 were deposited on the Si substrate 201 in the named sequence. A sidewall 206 serving as an insulating layer was also formed on the Si substrate 201. During a full-silicide formation process, silicide was formed by selectively removing the $Si_3N_4$ layer 204 by wet etching or dry etching and diffusing metal such as Ni or the like on the polysilicon layer 203.

In the process of forming a metal gate electrode with the gate structures 200 illustrated in FIG. 5A, a $SiO_2$ film 207 serving as a sacrificial film was formed between the adjoining gate structures 200 by plasma oxidization processing that made use of the plasma oxidization processing apparatus 100. Due to the fact that the plasma oxidization processing was performed after forming the gate structures 200, the $Si_3N_4$ layer 204 serving as a protection layer (cap layer), was oxidized to thereby form a SiON layer 205 on the surface of the $Si_3N_4$ layer 204, as illustrated in FIG. 5B.

Despite the necessity of removing the $Si_3N_4$ layer 204 ahead of the full-silicide formation, it became difficult to remove the $Si_3N_4$ layer 204 by, e.g., a wet etching method using hot phosphate solution, if the $Si_3N_4$ layer 204 was oxidized and the SiON layer 205 was formed thereon. Furthermore, when an attempt was made to remove the SiON layer 205 before the full-silicide formation by, e.g., a wet etching method using hydrofluoric acid, there was a fear that the SiO$_2$ film 207 already formed by the plasma oxidization processing would also be etched away or a film thickness thereof would be reduced.

For the reasons stated above, in case the SiO$_2$ film 207 is formed on the Si surface of a substrate having externally exposed silicon nitride and silicon by use of the plasma oxidization processing apparatus 100, it is preferable that, if possible, the Si substrate 201 is oxidized under a condition of not oxidizing the Si$_3$N$_4$ layer 204. With the plasma oxidization processing method of the present invention, the oxidation ratio of the Si substrate 201 and the Si$_3$N$_4$ layer 204 can be controlled with high selectivity as illustrated in FIG. 4A by maintaining the processing pressure at, e.g., 400 Pa or higher in the plasma oxidization processing apparatus 100. This makes it possible to perform such processing that oxidizes the Si substrate 201 but scarcely oxidizes the Si$_3$N$_4$ layer 204. More specifically, it is possible to perform highly selective oxidation processing by which the thickness ratio of the SiON layer 205 to the SiO$_2$ film 207 becomes 20% or less. Preferably, the thickness ratio can be kept 10% or less when the H$_2$/O$_2$ ratio is equal to or greater than 3. Accordingly, the present plasma oxidization processing method can be advantageously used in selectively forming a SiO$_2$ film with no oxidation of a Si$_3$N$_4$ film during a full-silicide formation process.

Figure 6:
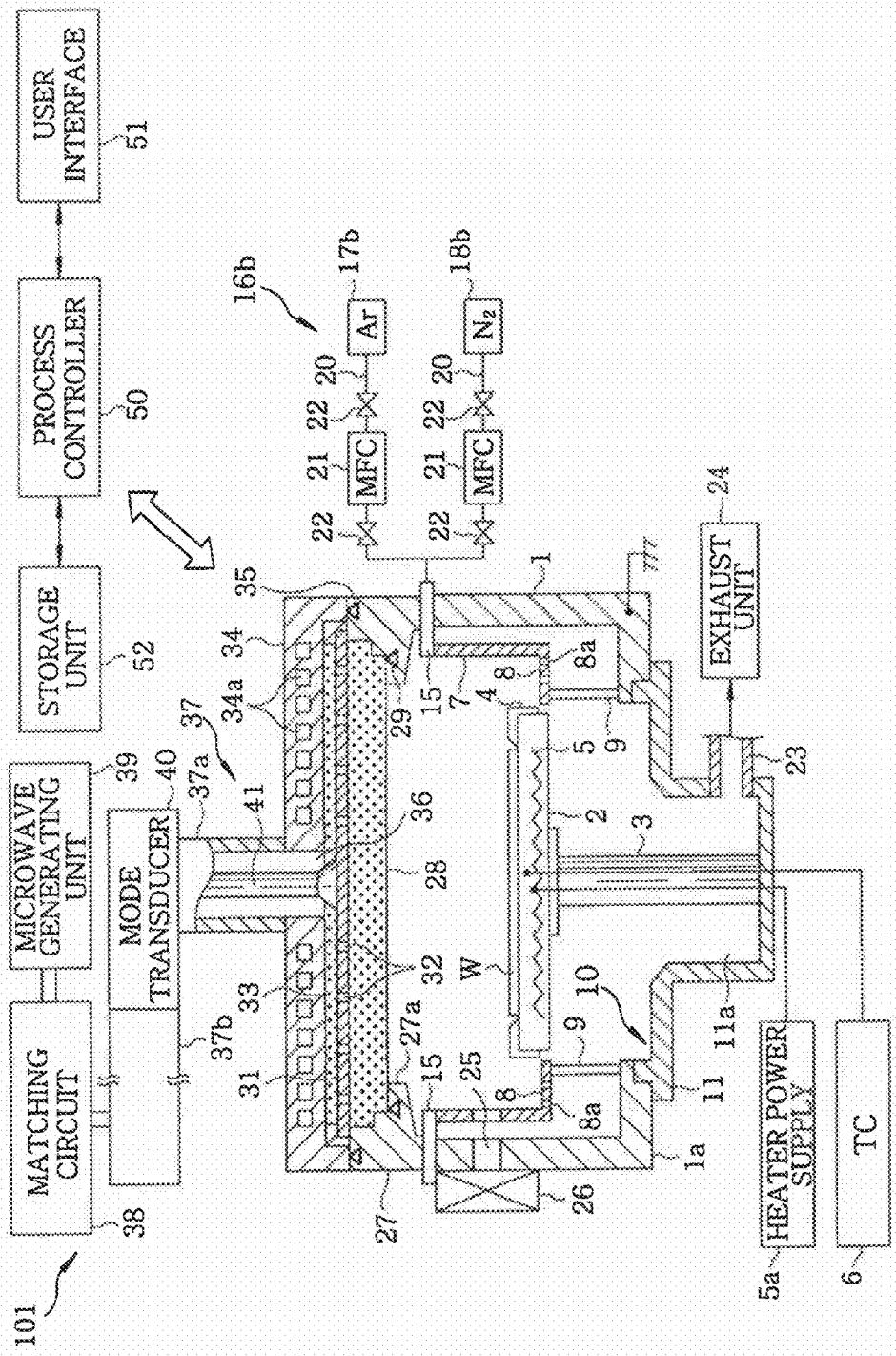
FIG. 6 is a schematic cross sectional view showing one exemplary plasma nitriding processing apparatus applicable in the present invention.

FIG. 6 is a cross sectional view schematically showing one example of a plasma nitride processing apparatus 101 suitably applicable in the selective plasma processing method of the present invention for selectively nitriding silicon against a silicon oxide film. The plasma nitride processing apparatus 101 has the same configuration as that of the plasma oxidization processing apparatus 100 except a difference in the processing gas supply system. Thus, only the difference will be described in the following and the same constituent parts will be designated by like reference numerals and description thereof will be omitted.

In the plasma nitride processing apparatus 101, the gas supply system 16b includes, e.g., an Ar gas source 17b and an N$_2$ gas source 18b. An Ar gas and an N$_2$ gas are fed to the gas introduction portion 15 via individual gas lines 20 and then introduced into the chamber 1 from the gas introduction portion 15. In the respective gas lines 20, there are provided mass flow controllers 21 and opening/closing valves 22, the latter of which are arranged before and after the former. Furthermore, in the plasma nitride processing apparatus 101, it may be possible to use a rare gas, e.g., a Kr gas, a Xe gas or a He gas in place of the Ar gas. Moreover, a nitrogen-containing gas, e.g., a NH$_3$ gas, a mixture gas of N$_2$ and H$_2$ or hydrazine, may be used in place of the N$_2$ gas.

The RLSA-type plasma nitriding processing apparatus 101 used in the present method can perform the processing of forming a silicon nitride film by selectively nitriding a silicon (polycrystalline or monocrystalline silicon) surface of a wafer W with no nitriding of a silicon oxide surface thereof. The order of this processing will be described herein below.

First, by opening the gate valve 26, the wafer W having a silicon surface and a silicon oxide surface is loaded into the chamber 1 through the loading/unloading port 25 and is mounted on the mounting table 2. Then, an Ar gas and a N$_2$ gas are introduced from the Ar gas source 17b and the N$_2$ gas source 18b of the gas supply system 16b into the chamber 1 through the gas introduction portion 15 at a specified flow rate.

More specifically, as an example, the flow rate of a rare gas including the Ar gas is set to range from 100 to 3000 mL/min (sccm) and the flow rate of the N$_2$ gas is set to range from 5 to 500 mL/min(sccm). The chamber is controlled to have an inner processing pressure of 400 Pa (3 Torr) or higher and preferably ranging from 400 Pa to 1333 Pa (3 Torr to 10 Torr). The wafer W is heated up to a temperature ranging from about 250 to 800° C. and preferably ranging from about 400 to 600° C. If the processing pressure is lower than 400 Pa at this time, the ion energy, ion density and electron temperature of plasma become increased relatively high, as can be seen in the below-described experimental examples. Therefore, it becomes impossible to obtain high enough nitriding selectivity of silicon with respect to a silicon oxide (SiO$_2$) film already subsisting on the wafer W.

Next, the microwaves generated in the microwave generating unit 39 are led to the waveguide 37 via the matching circuit 38 and then allowed to sequentially pass the rectangular waveguide 37b, the mode transducer 40 and the coaxial waveguide 37a, whereby the microwaves are supplied to the planar antenna member 31 through the internal conductor 41. The microwaves are then irradiated through the microwave irradiation holes 32 of the planar antenna member 31 toward the space of the chamber 1 above the wafer W through the transmitting plate 28. Within the rectangular waveguide 37b, the microwaves are propagated in a TE mode and converted to a TEM mode in the mode transducer 40. Then, the microwaves are propagated toward the planar antenna member 31 through the coaxial waveguide 37a. At this time, the microwaves may have power ranging from, e.g., 500 to 4000 W.

An electromagnetic field is formed within the chamber 1 by the microwaves irradiated from the planar antenna member 31 into the chamber 1 through the microwave transmitting plate 28, whereby the Ar gas and the N$_2$ gas are converted into a plasma. Thanks to the fact that the microwaves are irradiated through the multiple number of microwave irradiation holes 32 of the planar antenna member 31, the nitrogen-containing plasma has a high density ranging from about $1 \times 10^{10}$ to $5 \times 10^{12}/cm^3$ and a low electron temperature of about 1.2 eV or less in the vicinity of the wafer W. The highly selective nitrogen-containing plasma formed under this high pressure state exhibits low ion content and low ion energy and therefore helps to reduce plasma damage caused by ions or the like. In addition, by controlling the quantity of active species, mainly N-radicals, contained in the Ar/N$_2$ plasma, nitrogen is selectively introduced into silicon without nitriding silicon oxide, whereby a Si$_3$N$_4$ film 34 is uniformly formed on the silicon surface.

In the present embodiment, the wafer W having a silicon (polycrystalline or monocrystalline silicon) surface and a silicon oxide surface is plasma-nitrided by the plasma nitride processing apparatus 101 to form a silicon nitride film on the silicon surface. By maintaining the processing pressure at 400 Pa or higher and preferably ranging from 400 to 1333 Pa in this plasma processing, it is possible to generate highly selective plasma and, consequently, to nitride silicon with high selectivity (namely, while scarcely nitriding the silicon oxide film) with respect to a silicon oxide film (SiO$_2$) subsisting on the wafer W.

In this manner, a silicon nitride film of high quality can be formed on a monocrystalline or polycrystalline silicon surface with high selectivity but without nitriding a silicon oxide surface. Accordingly, the plasma nitride processing method of the present embodiment can be used to form a silicon nitride film in the manufacture of various kinds of semiconductor devices.

Next, a SiO$_2$ film (having a thickness of 4 nm) formed through thermal oxidization processing by use of a WVG (Water Vapor Generator) was plasma-nitrided under different pressures by using the plasma nitride processing apparatus 101 illustrated in FIG. 6. The results are shown in FIG. 7A wherein the vertical axis represents an N dosage within the thermally oxidized film after execution of the plasma nitride processing and the horizontal axis denotes a thickness of the nitride film (having a refractive index of 2.0) formed on a silicon substrate.

In this experiment, a gas system including Ar and N$_2$ was used as the processing gas. The ratio of the processing gas Ar/N$_2$ was set equal to 1000/100 mL/min(sccm). The processing pressure was set equal to 6.7 Pa (50 m Torr), 133.3 Pa (1 Torr) or 400 Pa (3 Torr). The processing temperature was set equal to 400° C. or 600° C. and the power of microwaves was set equal to 3.4 kW.

Figure 7A:
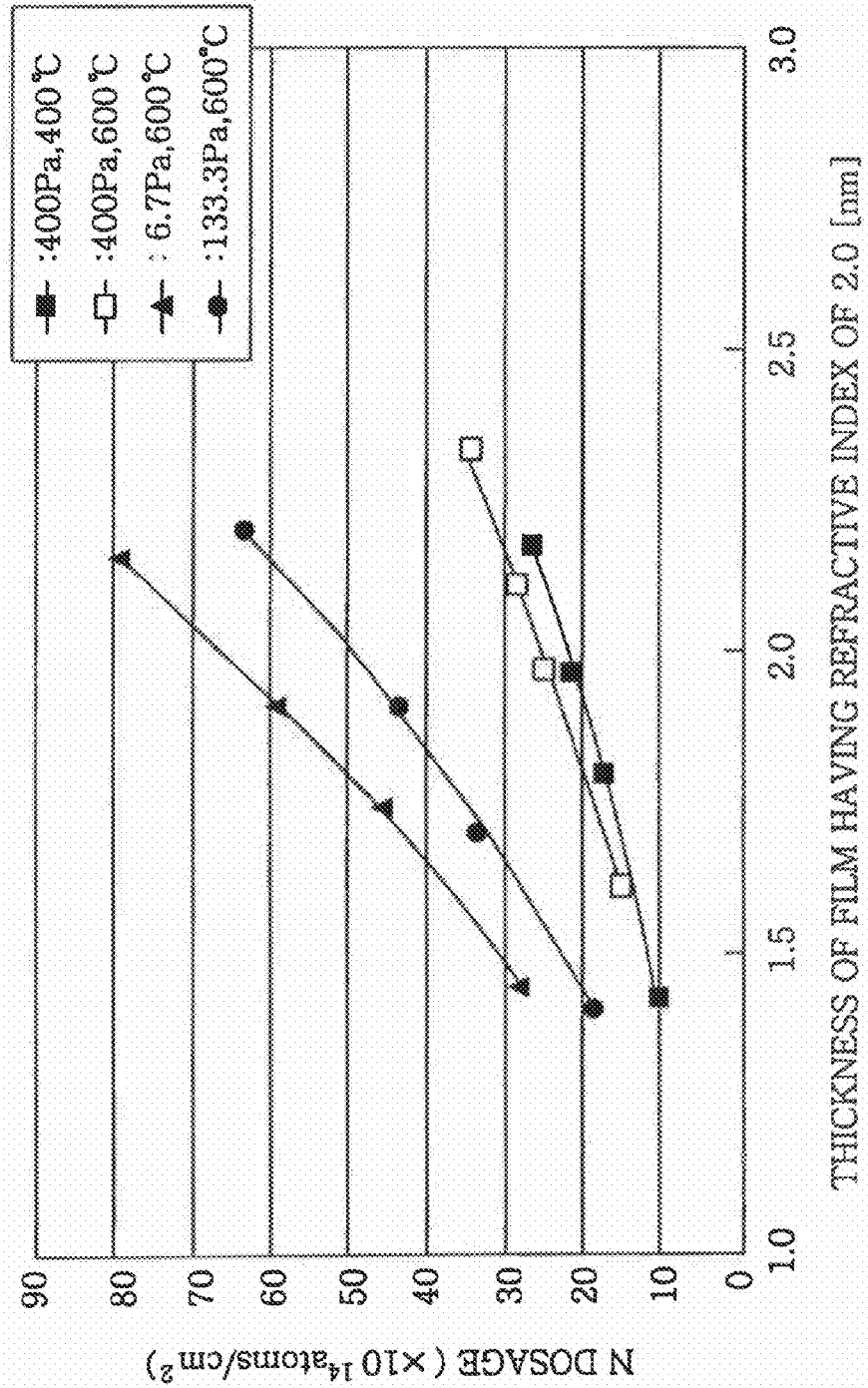
FIG. 7A is a graph representing a relationship between a film thickness and an N dosage in the plasma nitriding processing.

It can be seen in FIG. 7A that, regardless of the plasma nitride processing temperature, the N dosage within the SiO$_2$ film is smaller in case of the processing pressure being 400 Pa than in case of the processing pressure being 6.7 Pa or 133.3 Pa. This tendency became conspicuous as the thickness of the nitride film increased. This means that, when the nitride processing is performed by the plasma nitride processing apparatus 101, it is possible to suppress introducing of N into the SiO$_2$ film subsisting on the wafer by adopting a high pressure condition of 400 Pa or higher.

Next, plasma nitride processing was performed with respect to the SiO$_2$ film while changing pressures and gas flow rates by using the plasma nitride processing apparatus 101 illustrated in FIG. 6. The results are shown in FIG. 7B, wherein the vertical axis represents an N dosage within the thermally oxidized film after performing the plasma nitride processing and the horizontal axis denotes a flow rate ratio (%) of N$_2$ in the pre-processing gases.

In this experiment, a gas system including Ar and N$_2$ was used as the processing gas. The ratio of the processing gas Ar/N$_2$ was set equal to 1152/48 mL/min(sccm), 1000/200 mL/min(sccm) or 900/300 mL/min(sccm). The processing pressure was equal to 13.3 Pa, 26.7 Pa, 400 Pa, 533 Pa or 800 Pa. The processing temperature was set equal to 400° C. or 500° C. and the power of microwaves was set equal to 2.0 kW.

Figure 7B:
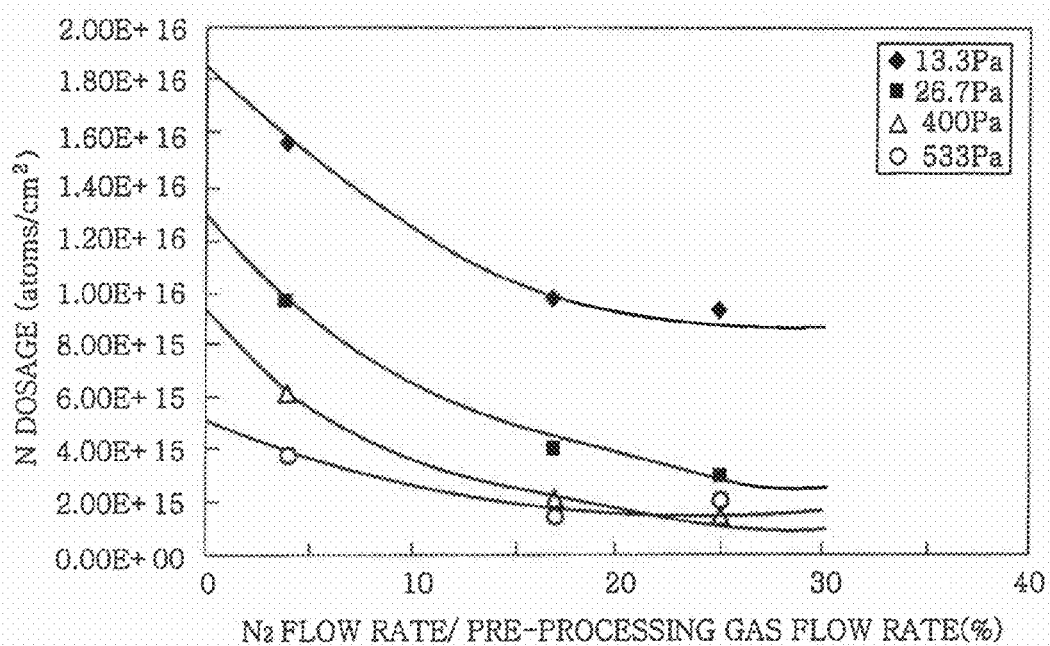
FIG. 7B is a graph representing a relationship between an $N_2$ flow rate ratio and an N dosage in the plasma nitriding processing.

It can be seen in FIG. 7B that, as the N$_2$ ratio in the processing gas increases, the N dosage within the SiO$_2$ film decreases, thereby making it possible to increase the selectivity. Particularly, it is preferable that the N$_2$ ratio in the processing gas is kept to range from 8% to 50% in order to keep the N dosage equal to or lower than $3 \times 10^{15}$ atoms/cm$^2$.

Figure 8A:
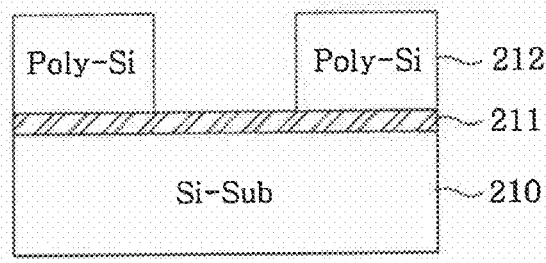
FIG. 8A is a view explaining an application example of the selective plasma nitriding processing of the present invention and shows a state before the plasma nitriding processing.
Figure 8B:
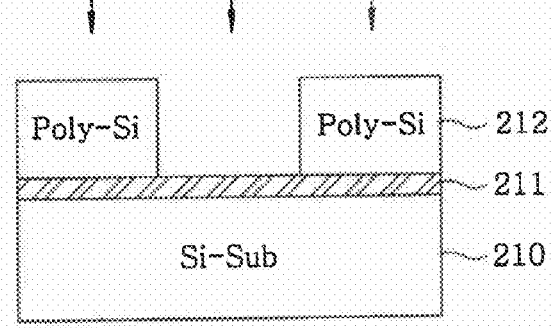
FIG. 8B is a view explaining an application example of the selective plasma nitriding processing of the present invention and shows a state during execution of the plasma nitriding processing.
Figure 8C:
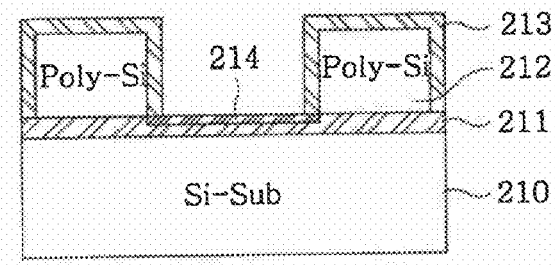
FIG. 8C is a view explaining an application example of the selective plasma nitriding processing of the present invention and shows a state after execution of the plasma nitriding processing.

Next, a preferred application example of the selective plasma nitriding processing of the present invention will be described with reference to FIGS. 8A to 8C. FIGS. 8A to 8C are views illustrating the steps of plasma-nitriding a target object having a silicon surface and a silicon oxide film surface. As illustrated in FIG. 8A, a silicon oxide (SiO$_2$) film 211 was formed on a Si substrate 210, and a patterned polysilicon layer 212 was formed on the silicon oxide film 211.

FIG. 8B illustrates a state that plasma nitriding processing was performed on the surface of the polysilicon layer 212 by using the plasma nitriding processing apparatus 101 having the same configuration as shown in FIG. 6. By this plasma nitriding processing, a silicon nitride (Si$_3$N$_4$) film 213 was formed on the surface of the polysilicon layer 212 as illustrated in FIG. 8C. In the conventional plasma nitriding processing method, nitriding is carried out by a plasma of high ion energy. This nitrides the surface of the silicon oxide film 211, thereby forming a SiON film 214. In order to avoid formation of the SiON film 214 as much as possible, it is preferable that the nitriding processing is performed under a condition in which only the polysilicon layer 212 is selectively nitrided without nitriding the silicon oxide film 211.

In view of this, the plasma nitriding processing method of the present invention was performed by the plasma nitriding processing apparatus 101 and, then, the thickness of the Si$_3$N$_4$ layer 213 formed on the surface of the polysilicon layer 212 was compared with the thickness of the SiON film 214 formed on the surface of the silicon oxide film 211. In this experiment, Ar and N$_2$ were used as the processing gas and supplied in a flow rate ratio of 1000/100 mL/min(sccm). The processing pressure was equal to 6.7 Pa (50 m Torr) or 400 Pa (3 Torr). The processing temperature was 400° C. and the power of microwaves was 3.4 kW.

In case the processing was performed at a low processing pressure of 6.7 Pa, the thickness of the Si$_3$N$_4$ layer 213 formed on the surface of the polysilicon layer 212 was 1.6 nm and the thickness of the SiON film 214 formed on the surface of the silicon oxide film 211 was 1.3 nm. Meanwhile, in case the processing was performed at a high processing pressure of 400 Pa, the thickness of the Si$_3$N$_4$ layer 213 formed on the surface of the polysilicon layer 212 was 1.6 nm as before but the thickness of the SiON film 214 formed on the surface of the silicon oxide film 211 was 0.4 nm. The ratio of the thickness of the SiON film 214 to the thickness of the Si$_3$N$_4$ layer 213 was about 81% in case of the processing pressure being 6.7 Pa and about 25% in case of the processing pressure being 400 Pa. These results confirm that the polysilicon layer 212 can be selectively nitrided when the processing pressure is kept high. In particular, the ratio of the thickness of the SiON film 214 to the thickness of the Si$_3$N$_4$ layer 213 can be reduced to 25% or less at the processing pressure ranging from 400 Pa to 1333 Pa. Therefore, the polysilicon layer 212 can be preferentially nitrided with high selectivity. It is also preferable that the ratio of the N$_2$ flow rate to the total gas flow rate is in a range between 0.08 and 0.08 to 0.5.

With the plasma nitriding processing method of the present invention, it is possible to control the nitriding ratio of the polysilicon layer 212 and the silicon oxide (SiO$_2$) film 211 by controlling the processing pressure to have a high value ranging from, e.g., 400 Pa to 1333 Pa, by use of the plasma nitriding processing apparatus 101. This makes it possible to perform the processing by which the polysilicon layer 212 is nitrided but the silicon oxide film 211 is hardly nitrided. More specifically, it is possible to reduce the ratio of the thickness of the SiON film 214 to the thickness of the Si$_3$N$_4$ film 213 to 25% or less and preferably to 10% or less. Accordingly, the plasma nitriding processing method of the present invention can be advantageously used in selectively forming the Si$_3$N$_4$ film 213 in the process of nitriding semiconductor devices.

As described above, the processing pressure is kept at 400 Pa or higher and preferably ranging from 400 Pa to 1333 Pa in the plasma processing using the plasma oxidization processing apparatus 100 or in the plasma processing using the plasma nitriding processing apparatus 101. By doing so, a substrate (wafer W) having silicon and a silicon nitride (Si$_3$N$_4$) layer or a silicon oxide (SiO$_2$) layer exposed on its surface can be oxidized or nitrided in such a way that the silicon is preferentially oxidized or nitrided with high selectivity without oxidizing the silicon nitride layer nor nitriding the silicon oxide layer. The reason why such selective plasma processing becomes available is that the ion energy of plasma can be reduced by controlling the processing pressure.

Figure 9:
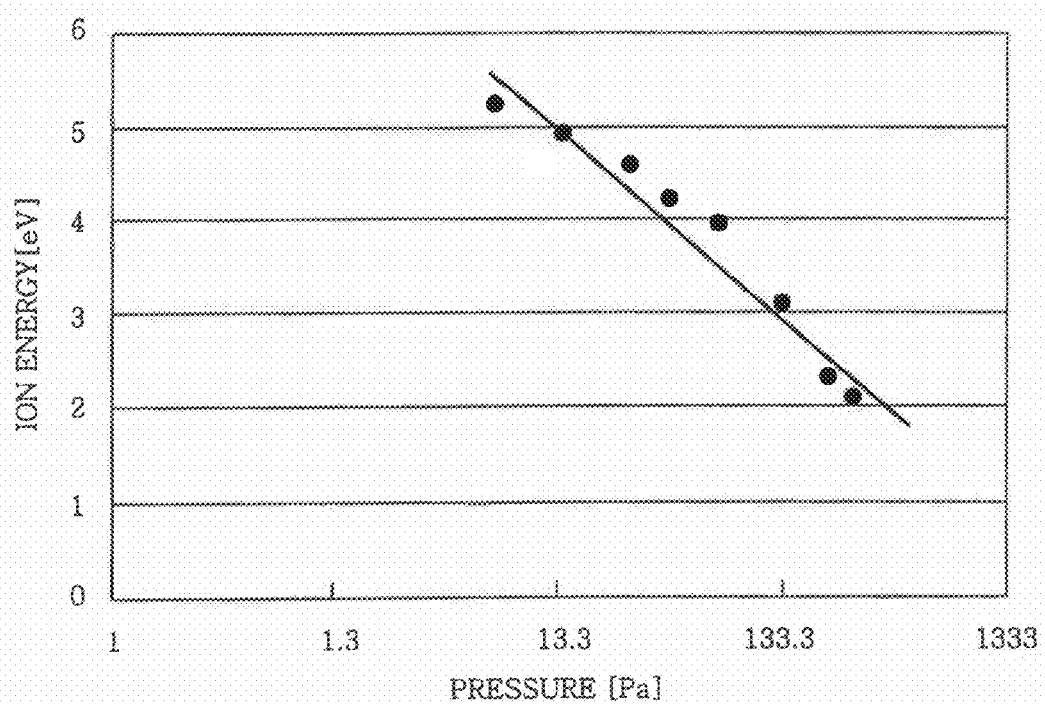
FIG. 9 is a graph representing a relationship between a processing pressure and plasma ion energy.

Measurement results for the relationship between the plasma ion energy and the processing pressure are illustrated in FIG. 9. In this experiment, nitrogen-containing plasma was generated at the Ar/N$_2$ flow rate ratio of 1000/40 and the microwave power of 2 kW in the plasma nitriding processing apparatus 101 having the planar antenna member 31 of 300 mm in diameter. It can be seen in FIG. 9 that there is a clear correlation between the processing pressure and the ion energy and further that the ion energy is decreased in inverse proportion to the processing pressure.

In the event that silicon is oxidized or nitrided by plasma, there is a need to supply energy greater than the bonding energy (2.3 eV) of a Si—Si bond. In case of the plasma oxidization processing or the plasma nitriding processing, this energy is supplied in the form of plasma ion energy. Meanwhile, the bonding energy of a Si—O bond is 4.6 eV and the bonding energy of a Si—N bond is 3.5 eV.

Accordingly, in the plasma oxidization processing performed with the plasma ion energy of greater than 3.5 eV, not only silicon is oxidized but also the Si—N bond subsisting on the wafer W is severed, thereby forming a Si—O bond. In other words, a $Si_3N_4$ film is oxidized into a SiON film. If the plasma ion energy is smaller than 3.5 eV, however, oxidization of the $Si_3N_4$ film is difficult to occur and silicon is selectively oxidized.

In the plasma nitriding processing performed with the plasma ion energy of greater than 4.6 eV, not only silicon is nitrided but also the Si—O bond subsisting on the wafer W is severed, thereby generating a Si—N bond. In other words, a $SiO_2$ film is nitrided to form a SiON film. If the plasma ion energy is smaller than 4.6 eV, however, nitriding of the $SiO_2$ film is difficult to occur and silicon is selectively nitrided.

As described above, in the present invention, the ion energy and radical quantity of plasma is controlled by regulating the pressure during plasma processing. This makes it possible to selectively oxidize or nitride silicon with high selectivity. In the plasma oxidization processing apparatus 100 and the plasma nitriding processing apparatus 101 of the type that generates plasma by introducing microwaves through the planar antenna member 31 having a plurality of slots (microwave irradiation holes 32), the plasma electron temperature remains low in the vicinity of a substrate (wafer W) and the controllability of ion energy by means of the pressure is superior. Therefore, the plasma oxidization processing apparatus 100 and the plasma nitriding processing apparatus 101 can be particularly advantageously used in the selective plasma processing of the present invention.

FIGS. 10A to 10D and FIGS. 11A to 11D show additional embodiments of the selective plasma processing method of the present invention.

Figure 10A:
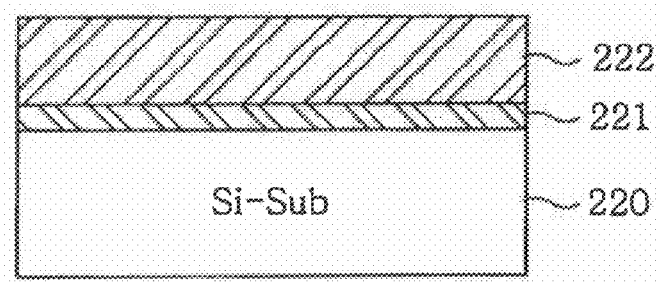
FIG. 10A is a view explaining another application example of the selective plasma oxidization processing of the present invention and shows a state that a silicon nitride film is deposited on a surface of a substrate.
Figure 10B:
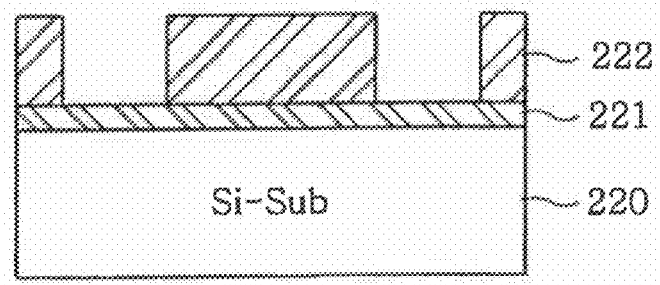
FIG. 10B is a view explaining another application example of the selective plasma oxidization processing of the present invention and shows a state that the silicon nitride film is pattern-formed.
Figure 10C:
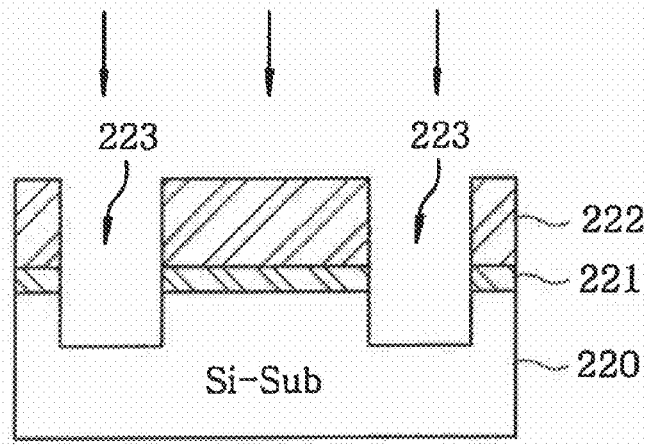
FIG. 10C is a view explaining another application example of the selective plasma oxidization processing of the present invention and shows a state that a trench is formed.

Shown in FIGS. 10A to 10D is an example in which the selective plasma processing of the present invention is applied to formation of an oxide film on an inner wall of a trench formed in a silicon substrate. As illustrated in FIG. 10A, a silicon oxide film 221 is formed on a silicon substrate 220 and a silicon nitride film 222 is deposited on the silicon oxide film 221 by, e.g., a thermal CVD method. Next, resist (not shown) is coated on the silicon nitride film 222. The resist is patterned by exposing and developing the same through the use of a photolithography technique. After forming a resist pattern having an opening that corresponds to the pattern of a device isolation region, the silicon nitride film 222 is patterned as illustrated in FIG. 10B by performing anisotropic etching with the resist pattern used as a mask. The resist pattern is then removed.

Figure 10D:
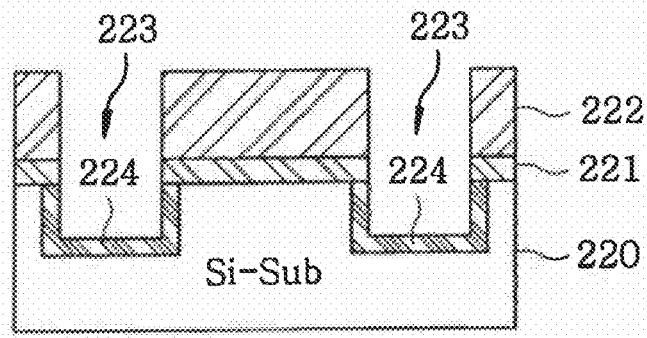
FIG. 10D is a view explaining another application example of the selective plasma oxidization processing of the present invention and shows a state that a silicon oxide film is selectively formed in the trench.

Next, by using the silicon nitride film 222 as a mask, the silicon oxide film 221 and the silicon substrate 220 is etched to thereby form trenches 223. Then, the inner walls of the trenches 223 are plasma-oxidized under the same conditions as noted above and by use of the plasma oxidization processing apparatus 100. At this time, by controlling the processing pressure, it is possible to perform the selective plasma oxidization processing by which silicon exposed within the trenches 223 is oxidized but the silicon nitride film 222 is not oxidized. This ensures that a silicon oxide film 224 can be selectively formed only within the trenches 223, as illustrated in FIG. 10D. After performing the oxidization processing, the surface of the silicon oxide film 224 may be nitrided into an oxynitride film by nitride processing.

FIGS. 11A to 11D shows another example in which the selective plasma processing of the present invention is applied to formation of an oxide film on an inner wall of a trench formed in a silicon substrate.

Figure 11A:
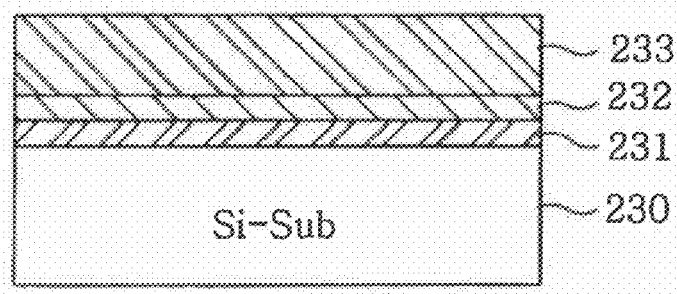
FIG. 11A is a view explaining a further application example of the selective plasma oxidization processing of the present invention and shows a state that a silicon nitride layer is deposited on a surface of a substrate.

Referring to FIG. 11A, a silicon oxide ($SiO_2$) film 231 is first formed on a silicon substrate 230 by thermally oxidizing the silicon substrate 230. Then, a polysilicon layer 232 is formed on the silicon oxide film 231 by use of a CVD (Chemical Vapor Deposition) device, after which a silicon nitride ($Si_3N_4$) layer 233 is formed on the polysilicon layer 232.

Figure 11B:
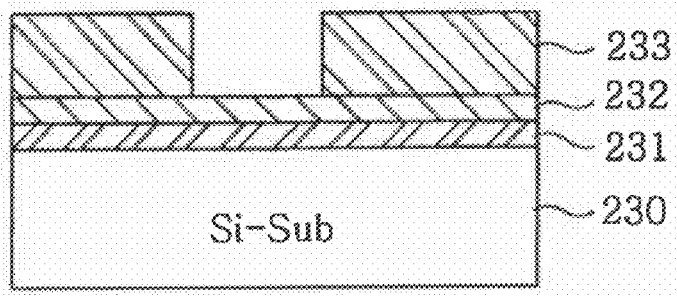
FIG. 11B is a view explaining a further application example of the selective plasma oxidization processing of the present invention and shows a state that the silicon nitride layer is pattern-formed.

Next, resist not shown in the drawings is coated on the silicon nitride layer 233 and then patterned by a photolithography technique to form a resist mask (not shown) By using the resist mask as a mask, anisotropic etching is performed to pattern the silicon nitride layer 233 as illustrated in FIG. 11B.

Subsequently, after removing the resist mask, the polysilicon layer 232 and the silicon oxide film 231 are removed until the silicon substrate 230 is exposed, by performing reactive ion etching with the patterned silicon nitride layer 233 used as a hard mask. A trench 224 is also formed in the silicon substrate 230 by performing the reactive ion etching.

Figure 11C:
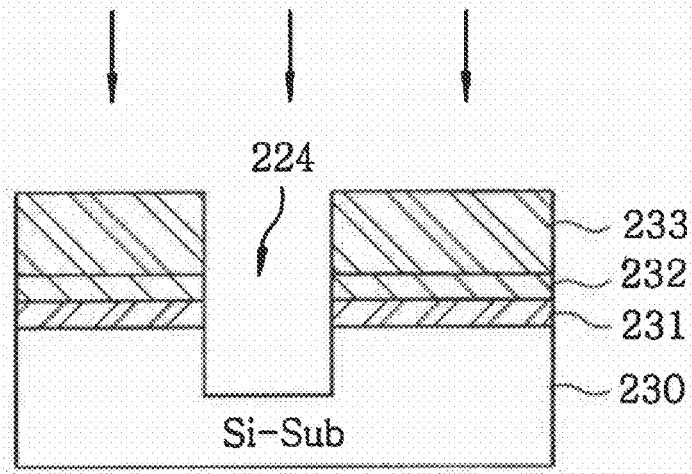
FIG. 11C is a view explaining a further application example of the selective plasma oxidization processing of the present invention and shows a state that an inner surface of a trench is being subjected to a plasma oxidization processing.
Figure 11D:
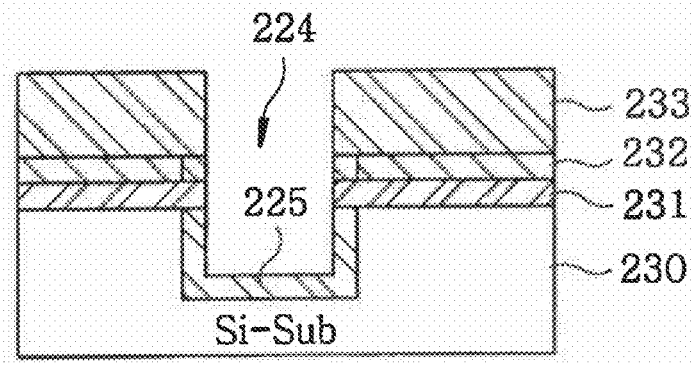
FIG. 11D is a view explaining another application example of the selective plasma oxidization processing of the present invention and shows a state that a silicon oxide film is selectively formed.

Next, as illustrated in FIG. 11C, the inner wall of the trench 224 is plasma-oxidized under the same conditions as noted above and by use of the plasma oxidization processing apparatus 100 shown in FIG. 1. At this time, by controlling the processing pressure, it is possible to perform the selective plasma oxidization processing by which silicon exposed within the trench 224 and an exposed surface of the polysilicon layer 232 are oxidized but the silicon nitride film 233 is not oxidized. This ensures that a silicon oxide film 225 can be selectively formed only within the trench 224 and on the polysilicon layer 232, as illustrated in FIG. 11D. After execution of the oxidization processing, the surface of the silicon oxide film 225 may be nitrided into an oxynitride film.

Although certain preferred embodiments of the present invention have been described hereinabove, the present invention is not limited thereto and may be modified or changed in many different forms.

As an example, instead of the RLSA-type plasma oxidization processing apparatus 100 and the RLSA-type plasma nitriding processing apparatus 101 used in the foregoing embodiments, it may be possible to use other plasma processing apparatuses, e.g., remote plasma type, ICP plasma type, ECR plasma type, surface reflective wave plasma type or magnetron plasma type processing apparatus. Since these plasma processing apparatuses generate a great deal of ion energy, it is desirable to use pulsed plasma or plasma whose ion energy is reduced by use of a shielding plate.

Although a semiconductor wafer was taken as an example of target objects for oxidization processing and nitride processing in the foregoing embodiments, the target objects are not limited thereto. The present invention may be applied to an instance that a glass substrate for Flat Panel Displays (FPDs) represented by a Liquid Crystal Display (LCD) is used as the target objects or an instance that a compound semiconductor is used as the target objects.

INDUSTRIAL APPLICABILITY

The selective plasma processing method in accordance with the present invention can be suitably used in the process of manufacturing various kinds of semiconductor devices.

What is claimed is:

1. A selective plasma processing method for, within a processing chamber of a plasma processing apparatus, acting oxygen-containing plasma on a target object having a silicon and a silicon nitride layer to selectively oxidize the silicon with respect to the silicon nitride layer and to form a silicon oxide film,
wherein the ratio of a thickness of a silicon oxynitride film formed on the silicon nitride layer to a thickness of the silicon oxide film formed by the oxidization is equal to or smaller than 20%.

2. The selective plasma processing method of claim 1, wherein the oxygen-containing plasma comprises microwave-excited high density plasma generated by introducing microwaves into the processing chamber through a planar antenna having a plurality of slots.

3. The selective plasma processing method of claim 1, wherein a processing pressure is 400 Pa or higher.

4. The selective plasma processing method of claim 3, wherein the processing pressure ranges from 400 Pa to 1333 Pa.

5. A selective plasma processing method for, within a processing chamber of a plasma processing apparatus, acting oxygen-containing plasma on a target object having a silicon exposing surface and a silicon nitride exposing surface to preferentially oxidize silicon on the silicon exposing surface in such a way that the ratio of a thickness of a silicon oxynitride film formed on the silicon nitride exposing surface to a thickness of a silicon oxide film formed on the silicon exposing surface becomes equal to or smaller than 20%.

6. A selective plasma processing method for, within a processing chamber of a plasma processing apparatus, acting nitrogen-containing plasma on a target object having a silicon and a silicon oxide layer thereon to selectively nitriding the silicon with respect to the silicon oxide layer and to form a silicon nitride film,
wherein the ratio of a thickness of a silicon oxynitride film formed on the silicon oxide layer to a thickness of the silicon nitride film formed by the nitriding is equal to or smaller than 25%.

7. The selective plasma processing method of claim 6, wherein the nitrogen-containing plasma comprises microwave excited high density plasma generated by introducing microwaves into the processing chamber through a planar antenna having a plurality of slots.

8. The selective plasma processing method of claim 6, wherein a processing pressure is 400 Pa or higher.

9. The selective plasma processing method of claim 8, wherein the processing pressure ranges from 400 Pa to 1333 Pa.

10. A selective plasma processing method for, within a processing chamber of a plasma processing apparatus, acting nitrogen-containing plasma on a target object having a silicon exposing surface and a silicon oxide exposing surface to preferentially nitride silicon on the silicon exposing surface in such a way that the ratio of a thickness of a silicon oxynitride film formed on the silicon oxide exposing surface to a thickness of a silicon nitride film formed on the silicon exposing surface becomes equal to or smaller than 25%.

11. A plasma processing apparatus comprising:
a vacuum-evacuated processing chamber including a table for supporting a target object; and
a control part adapted to control the plasma processing apparatus to have the apparatus to perform a selective plasma processing method for, within the processing chamber, acting oxygen-containing plasma on the target object having a silicon exposing surface and a silicon nitride exposing surface to preferentially oxidize silicon on the silicon exposing surface in such a way that the ratio of a thickness of a silicon oxynitride film formed on the silicon nitride exposing surface to a thickness of a silicon oxide film formed on the silicon exposing surface becomes equal to or smaller than 20%.

12. A plasma processing apparatus comprising:
a vacuum evacuable processing chamber including a mounting table for mounting a target object; and
a controller adapted to control the plasma processing apparatus to have the apparatus to perform a selective plasma processing method for, within the processing chamber, acting nitrogen-containing plasma on the target object having a silicon exposing surface and a silicon oxide exposing surface to preferentially nitride silicon on the silicon exposing surface in such a way that the ratio of a thickness of a silicon oxynitride film formed on the silicon oxide exposing surface to a thickness of a silicon nitride film formed on the silicon exposing surface becomes equal to or smaller than 25%.

* * * * *